United States Patent
Shim et al.

(10) Patent No.: US 10,658,043 B2
(45) Date of Patent: May 19, 2020

(54) METHOD OF ERASING DATA IN NONVOLATILE MEMORY DEVICE, NONVOLATILE MEMORY DEVICE PERFORMING THE SAME AND MEMORY SYSTEM INCLUDING THE SAME

(71) Applicant: Samsung Electronics Co., Ltd., Suwon-si, Gyeonggi-do (KR)

(72) Inventors: Won-Bo Shim, Seoul (KR); Sang-Wan Nam, Hwaseong-si (KR); Ji-Ho Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/164,845

(22) Filed: Oct. 19, 2018

(65) Prior Publication Data
US 2019/0198118 A1    Jun. 27, 2019

(30) Foreign Application Priority Data
Dec. 27, 2017    (KR) .................. 10-2017-0181410

(51) Int. Cl.
| | | |
|---|---|---|
| G11C 16/16 | (2006.01) | |
| G11C 16/26 | (2006.01) | |
| G11C 16/30 | (2006.01) | |
| G11C 7/10 | (2006.01) | |
| G11C 16/04 | (2006.01) | |
| G11C 8/14 | (2006.01) | |

(52) U.S. Cl.
CPC ............ *G11C 16/16* (2013.01); *G11C 7/1039* (2013.01); *G11C 16/0483* (2013.01); *G11C 16/26* (2013.01); *G11C 16/30* (2013.01); *G11C 8/14* (2013.01); *G11C 2216/16* (2013.01)

(58) Field of Classification Search
CPC ............ G11C 16/16; G11C 16/26; G11C 8/14
USPC .................... 365/185.17, 185.03, 185.22
See application file for complete search history.

(56) References Cited

U.S. PATENT DOCUMENTS

| 8,446,777 | B2 * | 5/2013 | Ueno ............... G11C 16/14 365/185.19 |
|---|---|---|---|
| 9,230,676 | B1 | 1/2016 | Pang et al. |
| 9,543,023 | B2 | 1/2017 | Lai et al. |
| 2012/0044764 | A1 * | 2/2012 | Nakai ............... G11C 16/14 365/185.11 |
| 2013/0107628 | A1 | 5/2013 | Dong et al. |
| 2014/0146609 | A1 | 5/2014 | Avila et al. |
| 2014/0247659 | A1 | 9/2014 | Dong et al. |
| 2015/0055412 | A1 | 2/2015 | Hung et al. |
| 2015/0364199 | A1 * | 12/2015 | Kang ............... H01L 27/10823 714/764 |

(Continued)

*Primary Examiner* — Han Yang
(74) *Attorney, Agent, or Firm* — Myers Bigel, P.A.

(57) ABSTRACT

A method of operating a memory device includes performing a data read operation on at least one victim sub-block within a memory block containing a plurality of sub-blocks therein, in response to an erase command directed to a selected sub-block within the plurality of sub-blocks. Next, a soft program operation is performed on the at least one victim sub-block. This soft programming operation is then followed by an operation to erase the selected sub-block within the plurality of sub-blocks. This operation to erase the selected sub-block may include providing an erase voltage to a bulk region of a substrate on which the memory block extends, and the at least one victim sub-block may be disposed between the selected sub-block and the substrate.

20 Claims, 15 Drawing Sheets

(56) References Cited

U.S. PATENT DOCUMENTS

| | | | |
|---|---|---|---|
| 2016/0042796 A1* | 2/2016 | Hsu | G11C 16/3445 365/185.11 |
| 2016/0217860 A1 | 7/2016 | Lai et al. | |
| 2016/0267995 A1 | 9/2016 | Chang et al. | |
| 2016/0351236 A1 | 12/2016 | Her et al. | |
| 2017/0168742 A1 | 6/2017 | Nam et al. | |

\* cited by examiner

METHOD OF ERASING DATA IN NONVOLATILE MEMORY DEVICE, NONVOLATILE MEMORY DEVICE PERFORMING THE SAME AND MEMORY SYSTEM INCLUDING THE SAME

REFERENCE TO PRIORITY APPLICATION

This application claims priority under 35 USC § 119 to Korean Patent Application No. 10-2017-0181410, filed Dec. 27, 2017, the disclosure of which is hereby incorporated herein by reference in its entirety.

BACKGROUND

1. Technical Field

Example embodiments of the invention relate to semiconductor devices and, more particularly, to nonvolatile memory devices and methods of operating same.

2. Description of Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered. Recently, semiconductor memory devices having memory cells that are stacked "vertically" (i.e., in three dimensions (3D)) have been researched to improve the capacity and integration density of the semiconductor memory devices.

SUMMARY

Methods of erasing data in nonvolatile memory devices, such as three-dimensional nonvolatile memory devices, can support higher reliability of erasure with improved and more accurate data retention characteristics in non-erased cells.

In some embodiments of the invention, a method of erasing data in a nonvolatile memory device, which includes a memory block including memory cells stacked in a direction intersecting a substrate, is provided. The memory block is divided into a plurality of sub-blocks that can be erased independently. In response to a data erase command, which is received and specified for a selected sub-block among the plurality of sub-blocks, a data read operation is initially performed on at least one victim sub-block among the plurality of sub-blocks, and then a soft program operation is selectively performed on the at least one victim sub-block based on a result(s) of the data read operation. After the soft program operation is performed, a data erase operation is performed on the selected sub-block. Based on this sequence of operations, the data erase operation for the selected sub-block may be efficiently performed, and damage to data stored in the at least one victim sub-block may be prevented to thereby support higher memory reliability.

According to additional embodiments of the invention, a memory device is provided, which includes a memory block, a row decoder and a control circuit. The memory block includes memory cells stacked in a direction intersecting a substrate. The memory block is divided into a plurality of sub-blocks, which may be erased independently. The row decoder can select the memory block by units of a sub-block. The control circuit receives a data erase command for a selected sub-block among the plurality of sub-blocks, then performs a data read operation on at least one victim sub-block among the plurality of sub-blocks. Next, a soft program operation is selectively performed on the at least one victim sub-block based on a result of the data read operation. A data erase operation is then performed on the selected sub-block after the data read operation is performed and the soft program operation is selectively performed.

According to additional embodiments of the invention, a memory system includes a memory controller and a nonvolatile memory device controlled by the memory controller. The nonvolatile memory device includes a memory block, a row decoder and a control circuit. The memory block includes memory cells stacked in a direction intersecting a substrate. The memory block is divided into a plurality of sub-blocks configured to be erased independently. The row decoder selects the memory block by units of a sub-block. The control circuit receives a data erase command for a selected sub-block among the plurality of sub-blocks, performs a data read operation on at least one victim sub-block among the plurality of sub-blocks, selectively performs a soft program operation on the at least one victim sub-block based on a result of the data read operation, and performs a data erase operation on the selected sub-block after the data read operation is performed and the soft program operation is selectively performed.

According to still further embodiments of the invention, a method of operating a nonvolatile memory device can include performing a data read operation on at least one victim sub-block within a memory block containing a plurality of sub-blocks, in response to an erase command directed to a selected sub-block within the plurality of sub-blocks. Then, based on the data read operation, a soft program operation may be performed on the at least one victim sub-block, in advance of performing a data erase operation on the selected sub-block within the plurality of sub-blocks. According to some of these embodiments of the invention, operations to perform a data erase operation may include providing an erase voltage to a bulk region of a substrate on which the memory block extends. The at least one victim sub-block may also be disposed between the selected sub-block and the substrate. In particular, the memory block may include a common source line, and the at least one victim sub-block may extend closer to the common source line relative to the selected sub-block.

According to further embodiments of the invention, the operations to perform a data read operation on the at least one victim sub-block may include reading first victim memory cells among a plurality of victim memory cells included in the at least one victim sub-block, using a first read voltage. These first victim memory cells can be commonly connected to a first word line within the memory block.

According to still further embodiments of the invention, the soft program operation may be performed as a "one-shot" program operation during which at least a plurality of the first victim memory cells are simultaneously programmed to thereby increase their respective threshold voltages. As will be understood by those skilled in the art, "one-shot" programming is frequently referred to as full sequence programming.

Additional embodiments of the invention may also include an integrated circuit device having a non-volatile memory device therein, which may contain a plurality of sub-blocks of memory cells therein. This non-volatile memory device is configured to perform a data erase operation on a selected sub-block within the plurality of sub-blocks of memory cells, in response to an erase command directed to the selected sub-block. This data erase operation includes performing a data read operation on at least one non-selected sub-block within the plurality of sub-blocks of memory cells, and then performing a soft program operation (e.g., one-shot program) on the at least one non-selected sub-block, before erasing the selected sub-block.

BRIEF DESCRIPTION OF THE DRAWINGS

Illustrative and non-limiting example embodiments will be more clearly understood from the following detailed description taken in conjunction with the accompanying drawings.

DETAILED DESCRIPTION OF THE EMBODIMENTS

Figure 1:
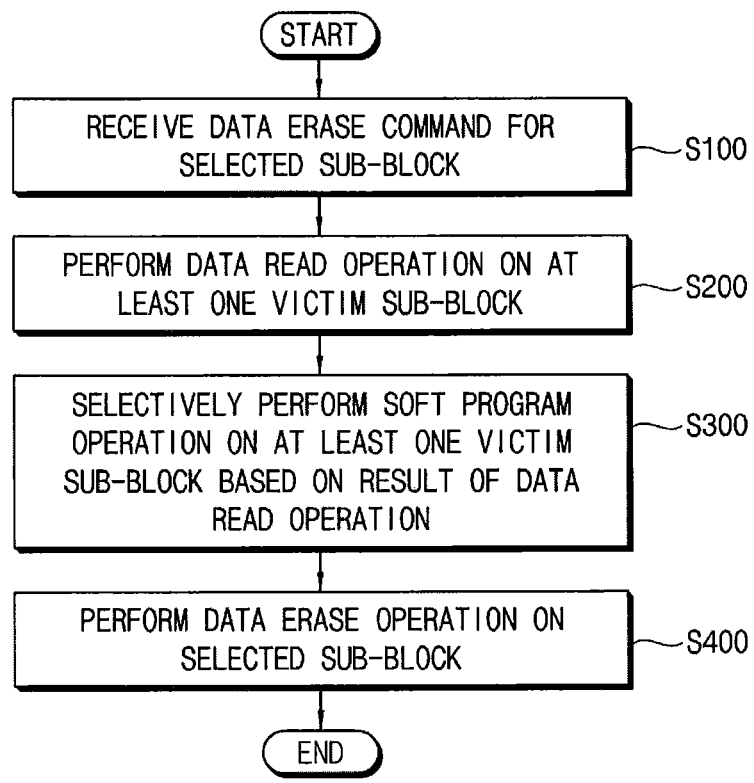
FIG. 1 is a flow chart illustrating a method of erasing data in a nonvolatile memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flow chart illustrating a method of erasing data in a nonvolatile memory device according to example embodiments. Referring to FIG. 1, a nonvolatile memory device according to example embodiments includes at least one memory block. The memory block includes a plurality of memory cells that are stacked in a direction intersecting (e.g., substantially perpendicular to) a substrate, and is divided into a plurality of sub-blocks that are erased independently. Configurations of the nonvolatile memory device and the memory block will be described in detail with reference to FIGS. 2 through 4.

In a method of erasing data in the nonvolatile memory device according to example embodiments, a data erase command is received for a selected sub-block among the plurality of sub-blocks (step S100). The nonvolatile memory device performs a data erase operation by units of a sub-block, and not by units of a memory block. When the data erase operation is to be performed on the selected sub-block, the data erase command for the selected sub-block is received first from an external memory controller.

A data read operation is performed on at least one victim sub-block among the plurality of sub-blocks (step S200). The at least one victim sub-block and the selected sub-block are included in the same memory block. The at least one victim sub-block is not a target for the data erase operation, however, data stored in the at least one victim sub-block can be damaged or lost when the data erase operation is performed on the selected sub-block. For example, the at least one victim sub-block may be disposed adjacent to the selected sub-block, but inventive concepts are not limited thereto.

In some embodiments of the invention, the at least one victim sub-block may be disposed closer to an erase source used in the data erase operation than the selected sub-block. A relationship between locations of the selected sub-block and the at least one victim sub-block will be described in detail with reference to FIG. 6 and elsewhere in the present specification.

A soft program operation is selectively performed on the at least one victim sub-block based on a result of the data read operation (step S300). For example, the soft program operation represents a program operation in which at least some of memory cells included in the at least one victim sub-block are programmed. The memory cells that are targets of the soft program operation may be deep-erased memory cells, each of which has an erase state and is relatively deeply erased. The soft program operation will be described in detail with reference to FIGS. 7A, 7B, and elsewhere in the present specification.

The data erase operation is performed on the selected sub-block after the data read operation is performed and the soft program operation is selectively performed (step S400). For example, the data erase operation on the selected sub-block may be performed based on a delayed floating scheme, which will be described in detail with reference to FIGS. 13 and 14.

Figure 2:
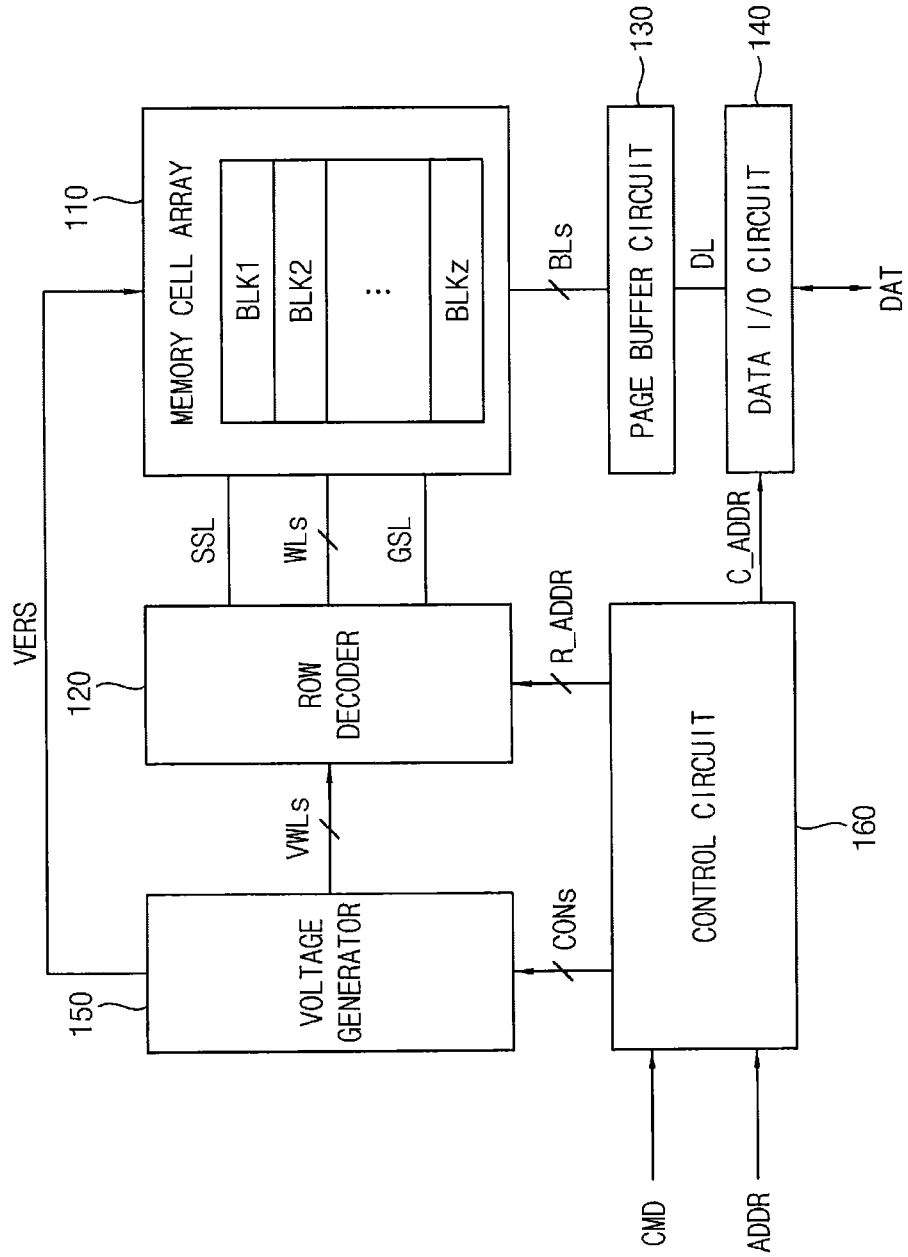
FIG. 2 is a block diagram illustrating a nonvolatile memory device according to example embodiments.

FIG. 2 is a block diagram illustrating a nonvolatile memory device according to example embodiments. Referring to FIG. 2, a nonvolatile memory device 100 includes a memory cell array 110, a row decoder 120, a page buffer circuit 130, a data input/output (I/O) circuit 140, a voltage generator 150 and a control circuit 160. The memory cell array 110 is connected to the row decoder 120 via at least one string selection line SSL, a plurality of wordlines WLs and at least one ground selection line GSL. The memory cell array 110 is further connected to the page buffer circuit 130 via a plurality of bitlines BLs.

The memory cell array 110 may include a plurality of memory cells (e.g., a plurality of nonvolatile memory cells) that are connected to the plurality of wordlines WLs and the plurality of bitlines BLs. The memory cell array 110 may be divided into a plurality of memory blocks BLK1, BLK2, ..., BLKz, each of which includes memory cells. As will be described with reference to FIG. 4, each memory block may be divided into a plurality of sub-blocks. The nonvolatile memory device 100 performs a data erase operation by units of a sub-block.

In some example embodiments, as will be described with reference to FIGS. 3 and 4, the memory cell array 110 may be a three-dimensional memory cell array, which is formed on a substrate in a three-dimensional structure (or a vertical structure). In this example, the memory cell array 110 may include a plurality of NAND strings that are vertically oriented such that at least one memory cell is located over another memory cell. In other example embodiments, the memory cell array 110 may be a two-dimensional memory cell array, which is formed on a substrate in a two-dimensional structure (or a horizontal/planar structure).

The control circuit 160 receives a command CMD and an address ADDR from a memory controller (e.g., a memory controller 600 in FIG. 15), and controls the row decoder 120, the page buffer circuit 130, the data I/O circuit 140 and the voltage generator 150 based on the command CMD and the address ADDR to perform data erase/write (or program)/read operations for the memory cell array 110. For example, the control circuit 160 may generate control signals CONs for controlling the voltage generator 150 based on the command CMD, and may generate a row address R_ADDR and a column address C_ADDR based on the address ADDR. The control circuit 160 may provide the row address R_ADDR to the row decoder 120, and may provide the column address C_ADDR to the data I/O circuit 140.

In addition, the control circuit 160 controls the row decoder 120, the page buffer circuit 130, the data I/O circuit 140 and the voltage generator 150 based on the command CMD and the address ADDR to perform the method of erasing data according to example embodiments described with reference to FIG. 1. The row decoder 120 is connected to the memory cell array 110 via the at least one string selection line SSL, the plurality of wordlines WLs and the at least one ground selection line GSL.

During data erase/write/read operations, the row decoder 120 may determine at least one of the plurality of wordlines WLs as a selected wordline, and may determine the rest or remainder of the plurality of wordlines WLs other than the selected wordline as unselected wordlines, based on the row address R_ADDR. In addition, during a data erase operation, the row decoder 120 may select one of the plurality of memory blocks BLK1, BLK2, ..., BLKz based on a block address, and may select at least one of a select sub-block among a plurality of sub-blocks that are included in the selected memory block and are erased independently.

The voltage generator 150 may generate wordline voltages VWLs that are required for an operation of the nonvolatile memory device 100 based on the control signals CONs. The wordline voltages VWLs may be applied to the plurality of wordlines WLs via the row decoder 120. In addition, the voltage generator 150 may generate an erase voltage VERS for the data erase operation based on the control signals CONs. The erase voltage VERS may be directly applied to the memory cell array 110. For example, during the data erase operation, the voltage generator 150 may apply the erase voltage VERS to a bulk region (or a well) in the substrate on which the memory blocks BLK1, BLK2, ..., BLKz are formed, may apply an erase wordline voltage (e.g., a ground voltage) to the selected wordline of one sub-block (e.g., the selected sub-block) via the row decoder 120, and may apply an erase pass voltage to the unselected wordlines via the row decoder 120 to float the unselected wordlines. During an erase verification operation, the voltage generator 150 may apply an erase verification voltage to all of the wordlines of one sub-block or sequentially apply the erase verification voltage on a wordline-by-wordline basis. In particular, during the data program operation (or the data write operation), the voltage generator 150 may apply a program voltage to the selected wordline via the row decoder 120, and may apply a program pass voltage to the unselected wordlines via the row decoder 120. Then, during a program verification operation, the voltage generator 150 may apply a program verification voltage to tile selected wordline via the row decoder 120, and may apply a verification pass voltage to the unselected wordlines via the row decoder 120. In addition, during the data read operation, the voltage generator 150 may apply a read voltage to the selected wordline via the row decoder 120, and may apply a read pass voltage to the unselected wordlines via the row decoder 120.

The page buffer circuit 130 may be connected to the memory cell array 110 via the plurality of bitlines BLs. The page buffer circuit 130 may include a plurality of page buffers. In some example embodiments, each page buffer may be connected to one bitline. In other example embodiments, each page buffer may be connected to two or more bitlines. The page buffer circuit 130 may store data DAT to be programmed into the memory cell array 110 or may read data DAT sensed from the memory cell array 110. In other words, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from an outside of the nonvolatile memory device 100 (e.g., from the memory controller 600 in FIG. 15) to the memory cell array 110 via the page buffer circuit 130 or may provide the data DAT from the memory cell array 110 to the outside of the nonvolatile memory device 100, based on the column address C_ADDR.

Figure 3:
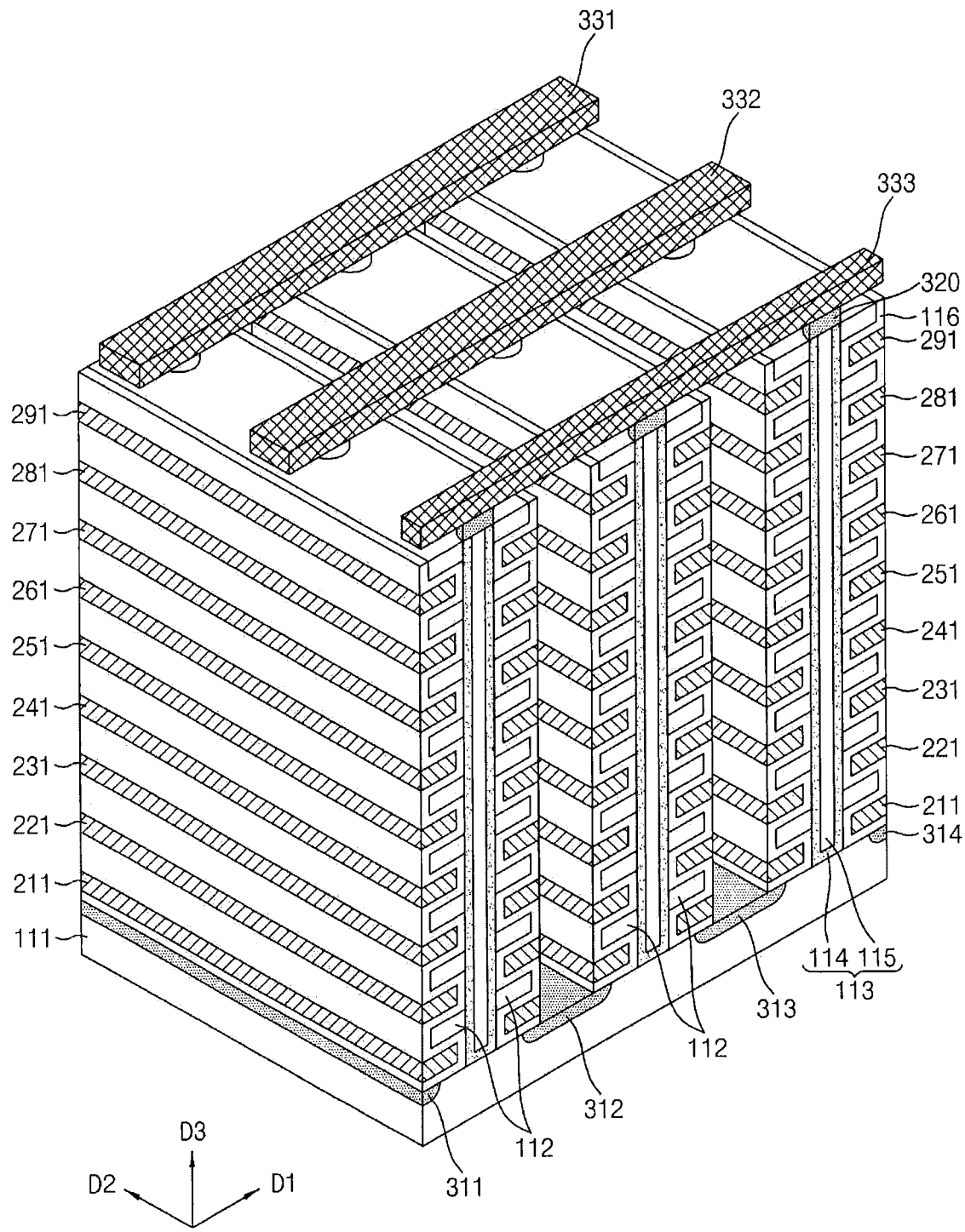
FIG. 3 is a perspective view of a memory block that is included in a memory cell array of the nonvolatile memory device of FIG. 2.

FIG. 3 is a perspective view illustrating an example of a memory block that is included in a memory cell array of the nonvolatile memory device of FIG. 2. Referring to FIG. 3, a memory block BLKi includes NAND strings which are formed on a substrate in a three-dimensional structure (or a vertical structure). The memory block BLKi includes structures extending along first, second and third directions D1, D2 and D3. A substrate 111 is provided, which may have a well of a first type (e.g., a first conductive type). For example, the substrate 111 may have a p-well formed by implanting a group 3 element such as boron (B). And, the substrate 111 may have a pocket p-well provided in an n-well. In one embodiment, the substrate 111 has a p-type well (or a p-type pocket well). However, the conductive type of the substrate 111 is not limited to p-type.

A plurality of doping regions 311, 312, 313 and 314 extending along the first direction D1 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to n-type.

A plurality of insulation materials 112 extending along the second direction D2 are sequentially provided along the third direction D3 on a region of the substrate 111 between the first and second doping regions 311 and 312. For example, the plurality of insulation materials 112 are provided along the second direction D3, being spaced by a specific distance. For example, the insulation materials 112 may include an insulation material such as an oxide layer.

A plurality of pillars 113 penetrating the insulation materials along the third direction D3 are sequentially disposed along the second direction D2 on a region of the substrate 111 between the first and second doping regions 311 and 312. For example, the plurality of pillars 113 penetrate the insulation materials 112 to contact the substrate 111.

In some example embodiments, each pillar 113 may include a plurality of materials. For example, a channel layer 114 of each pillar 113 may include a silicon material having a first type, and this channel layer 114 may include a silicon material having the same type as the substrate 111. In one embodiment, the channel layer 114 of each pillar 113 includes a p-type silicon, but is not limited to p-type silicon in other embodiments of the invention.

An internal material 115 of each pillar 113 includes an insulation material, such as silicon oxide. And, the inner material 115 of each pillar 113 may include an air gap. An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of first conductive materials 211, 221, 231, 241, 251, 261, 271, 281 and 291. In some examples, the insulation layer 116 need not be provided between the first conductive materials 211 to 291 corresponding to ground select lines GSL (e.g., 211) and string select lines SSL (e.g., 291). As illustrated in this embodiment, the ground select lines GSL are the lowermost ones of the stack of first conductive materials 211 to 291 and the string select lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the second direction D2 is provided between the insulation material 112 adjacent to the substrate 111 and the substrate 111. In more detail, the first conductive material 211 extending along the second direction D2 is provided between the insulation layer 116 at the bottom of the insulation material 112 adjacent to the substrate 111 and the substrate 111.

A first conductive material extending along the second direction D2 is provided between the insulation layer 116 at the top of the specific insulation material among the insulation materials 112 and the insulation layer 116 at the bottom of a specific insulation material among the insulation materials 112. For example; a plurality of first conductive materials 221 to 281 extending along the second direction D2 are provided between the insulation materials 112 and it may be understood that the insulation layer 116 is provided between the insulation materials 112 and the first conductive materials 221 to 281. The first conductive materials 211 to 291 may be formed of a conductive metal. In some embodiments of the invention, the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the second direction D2, a plurality of pillars 113 disposed sequentially along the second direction D2 and penetrating the plurality of insulation materials 112 along the third direction D3, an insulation layer 116 provided on the exposed surfaces of the plurality of insulation materials 112 and the plurality of pillars 113, and a plurality of first conductive materials 211 to 291 extending along the second direction D2. In addition, the same structures as those on the first and second doping regions 311 and 312 may be provided in a region between the third and fourth doping regions 313 and 314. In the region between the third and fourth doping regions 313 and 314, provided are a plurality of insulation materials 112 extending along the second direction D2, a plurality of pillars 113 disposed sequentially along the second direction D2 and penetrating the plurality of insulation materials 112 along the third direction D3, an insulation layer 116 provided on the exposed surfaces of the plurality of insulation materials 112 and the plurality of pillars 113, and a plurality of first conductive materials 211 to 291 extending along the second direction D2.

A plurality of drains 320 are provided on the plurality of pillars 113, respectively. The drains 320 may include silicon materials doped with a second type. For example, the drains 320 may include silicon materials doped with an n-type. In an embodiment, the drains 320 include n-type silicon materials. However, the drains 320 are not limited to the n-type silicon materials.

On the drains, a plurality of second conductive materials 331, 332 and 333 extending along the first direction D1 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the first direction D1 may be connected through each contact plug. The second conductive materials 331 to 333 may include metal materials. The second conductive materials 331 to 333 may include conductive materials such as a polysilicon.

In an example of FIG. 3, the first conductive materials 211 to 291 may be used to form the wordlines WLs, the string selection line SSL and the ground selection line GSL. For example, the first conductive materials 221 to 281 may be used to be as the wordlines WLs, where conductive materials belonging to the same layer may be interconnected. The memory block BLKi may be selected when the first conductive materials 211 to 291 are all selected. In contrast, a sub-block may be selected when only a part of the first conductive materials 211 to 291 is selected. The number of layers of the first conductive materials 211 to 291 may be changed variously according to process and control techniques.

Figure 4:
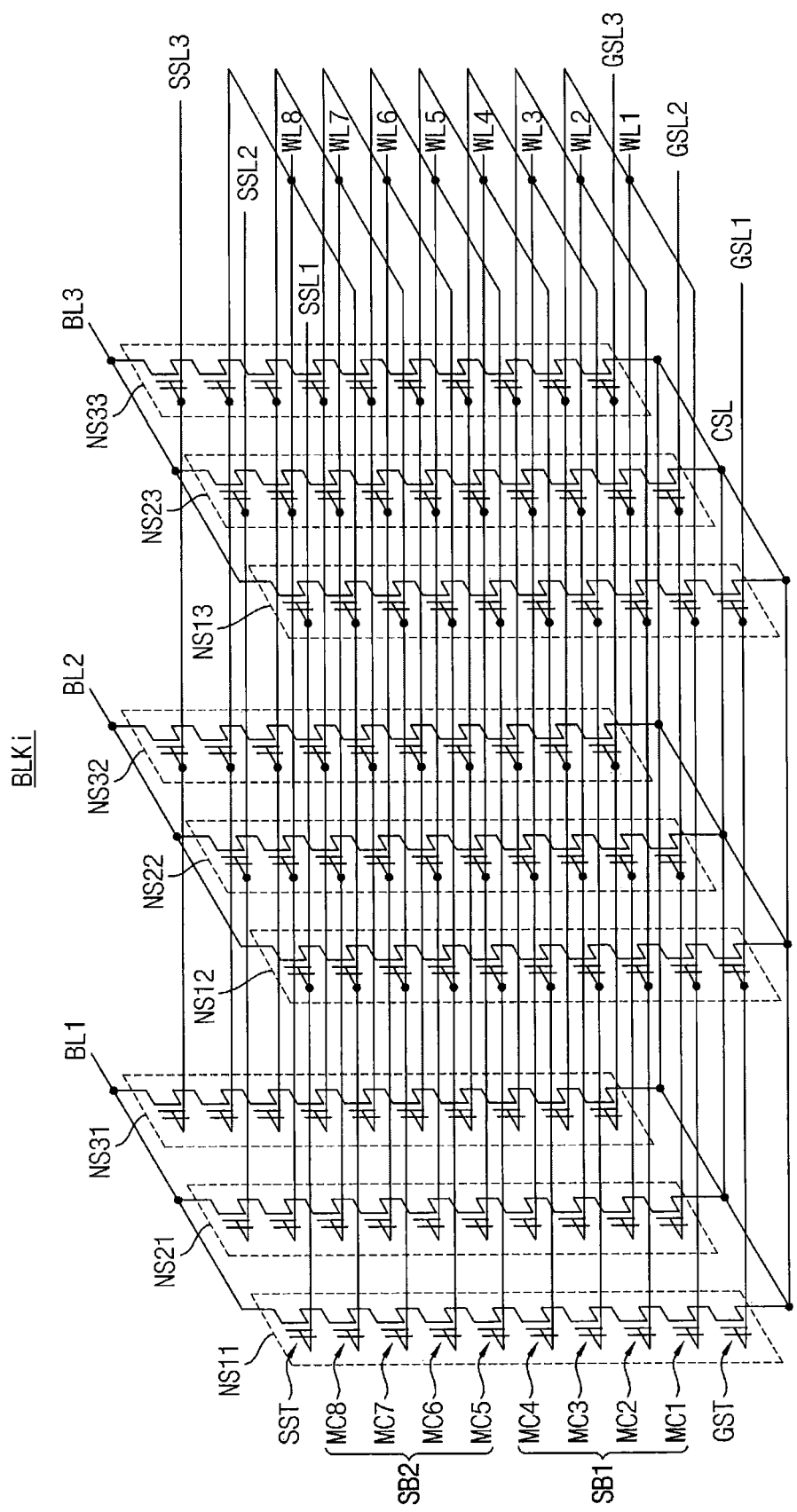
FIG. 4 is a circuit diagram illustrating an equivalent circuit of the memory block described with reference to FIG. 3.

FIG. 4 is a circuit diagram illustrating an equivalent circuit of the memory block described with reference to FIG. 3. The memory block BLKi of FIG. 4 may be formed on a substrate in a three-dimensional structure (i.e., a vertical structure). For example, a plurality of NAND strings or NAND strings included in the memory block BLKi may be formed in a direction perpendicular to the substrate. Referring to FIG. 4, the memory block BLKi may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, . . . , MC8, and a ground selection transistor GST. For example, the bitlines BL1 to BL3 may correspond to the second conductive materials 331 to 333 in FIG. 3, and the common source line CSL may be formed by interconnecting the first to fourth doping regions 311 to 314 in FIG. 3.

Each string selection transistor SST may be connected to a corresponding string selection line (one of SSL1, SSL2 and SSL3). The plurality of memory cells MC1 to MC8 may be connected to corresponding wordlines WL1, WL2, . . . , WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In the example of FIG. 4, some of the string selection transistors SST are connected to the same bitline (e.g., one of BL1 to BL3) to connect corresponding NAND strings to the same bitline up appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer may share a common wordline. Cell strings in the same row share a string selection line. The common source line CSL is connected in common to all of cell strings.

In an example of FIG. 4, the memory block BLKi is divided into a plurality of sub-blocks, indicated by representative sub-blocks SB1 and SB2, each sub-block being smaller in size than the memory block BLKi. The sub-blocks SB1 and SB2 may be divided in a wordline direction, as shown in FIG. 4. For example, the sub-block SB1 may include memory cells MC1 to MC4 connected to the wordlines WL1 to WL4, and the sub-block SB2 may include memory cells MC5 to MC8 connected to the wordlines WL5 to WL8. Alternatively, the sub-blocks SB1 and SB2 may be divided on the basis of bitlines or string selection lines. The sub-blocks SB1 and SB2 in the memory block BLKi may be erased independently regardless of the reference used to divide the memory block into sub-blocks.

In FIG. 4, the memory block BLKi is illustrated to be connected to eight wordlines WL1 to WL8 and three bitlines BL1 to BL3, each of the NAND strings NS11 to NS33 is illustrated to include eight memory cells MC1 to MC8, and each sub-block is illustrated to be connected to four wordlines However, inventive concepts are not limited thereto. In some example embodiments, each memory block in the memory cell array 100 may be connected to any number of wordlines and bitlines, each NAND string may include any number of memory cells, and/or each sub-block may be connected to any number of wordlines.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; and 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 5:
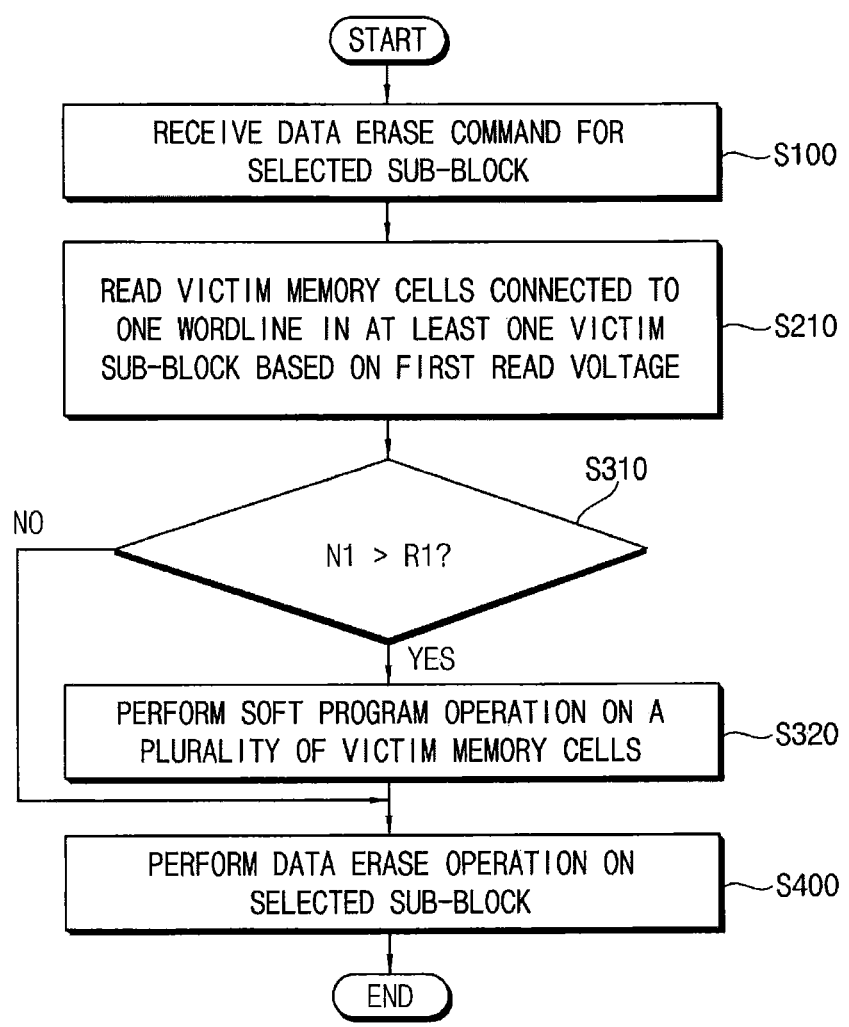
FIG. 5 is a flow chart illustrating a method of erasing data in a nonvolatile memory device according to example embodiments.
Figure 6:
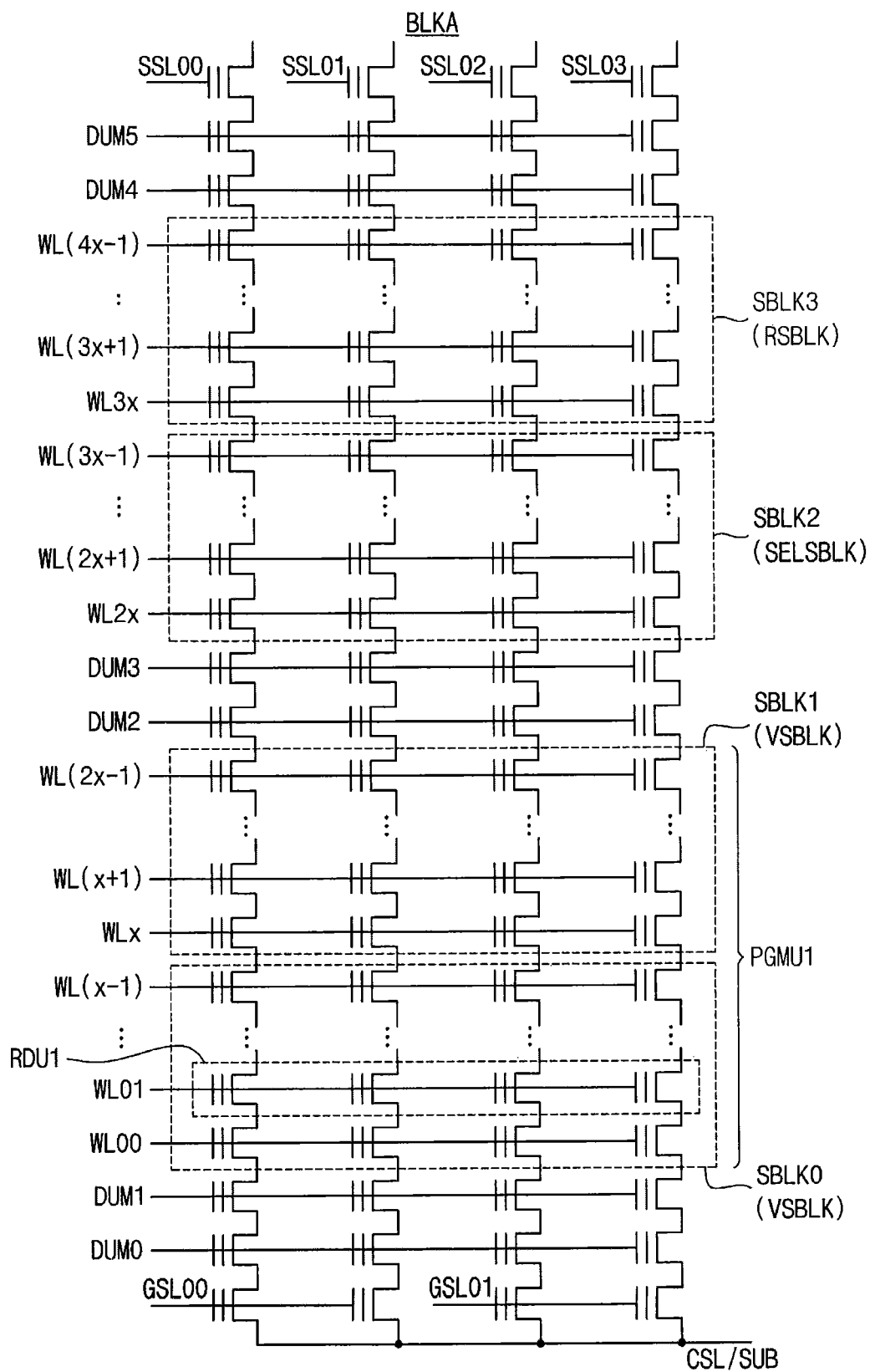
FIGS. 6, 7A and 7B are diagrams that illustrate methods of erasing data in the nonvolatile memory device of FIG. 5.
Figure 7A:
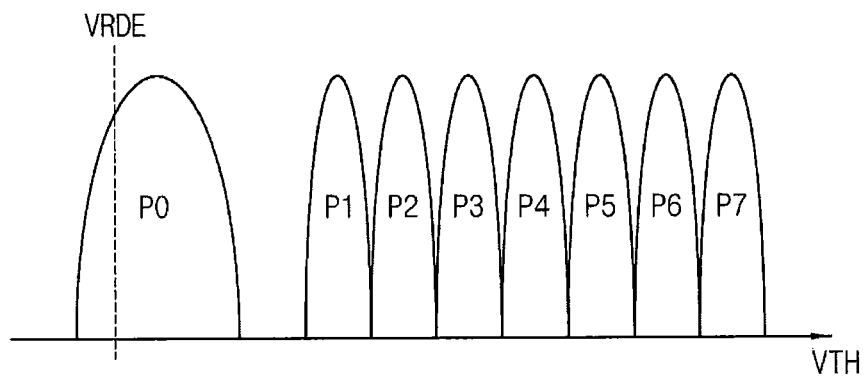
Figure 7B:
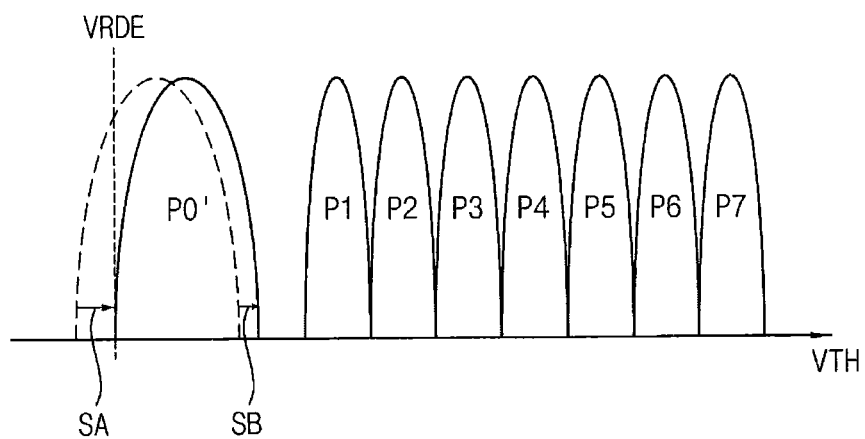

FIG. 5 is a flow chart illustrating a method of erasing data in a nonvolatile memory device according to example embodiments. FIGS. 6, 7A and 7B are diagrams for describing the method of erasing data in the nonvolatile memory device of FIG. 5. FIG. 6 is a circuit diagram illustrating an equivalent circuit of a memory block which is formed on a substrate in a three-dimensional structure. FIGS. 7A and 7B are graphs illustrating a distribution of a threshold voltage VTH (or a threshold voltage distribution) of victim memory cells included in the victim sub-block before and after the soft program operation is performed, respectively.

Referring to FIGS. 5, 6, 7A and 7B, in a method of erasing data in a nonvolatile memory device according to example embodiments, a data erase command is received for a selected sub-block SELSBLK among a plurality of sub-blocks SBLK0, SBLK1, SBLK2 and SBLK3 included in a memory block BLKA (step S100). The selected sub-block SELSBLK may be a target sub-block for the data erase operation.

As illustrated in FIG. 6, the memory block BLKA may include the plurality of sub-blocks SBLK0 to SBLK3 that are sequentially stacked on one another. The sub-block SBLK0 may include memory cells that are connected to wordlines WL00, WL01, WL(x−1), the sub-block SBLK1 may include memory cells that are connected to wordlines WLx, WL(x+1), . . . , WL(2x−1), the sub-block SBLK2 may include memory cells that are connected to wordlines WL2x, WL(2x+1), . . . , WL(3x−1), and the sub-block SBLK3 may include memory cells that are connected to wordlines WL3x, WL(3x+1), . . . , WL(4x−1). The sub-blocks SBLK0 to SBLK3 may be connected to ground selection transistors that are connected to ground selection lines GSL00 and GSL01, and may be connected to string selection transistors that are connected to string selection lines SSL00, SSL01, SSL02 and SSL03.

In FIG. 6, the sub-block SBLK2 may be determined as the selected sub-block SELSBLK. When the selected sub-block SELSBLK is determined, at least one of the remainder sub-blocks SBLK0, SBLK1 and SBLK3 other than the sub-block SBLK2 determined as the selected sub-block SELSBLK may be determined as a victim sub-block VSBLK based on a location of the selected sub-block SELSBLK and a characteristic of the data erase operation.

In some example embodiments, the victim sub-block VSBLK may be disposed or arranged closer to an erase source used in the data erase operation than the selected sub-block SELSBLK. For example, in the data erase operation, the erase voltage VERS may be applied to a bulk region (e.g., a well) in a substrate SUB (e.g., the substrate 111 in FIG. 3) on which the memory block BLKA is formed, and the substrate SUB and/or the bulk region in the substrate SUB may correspond to the erase source. Thus, the victim sub-block VSBLK may be disposed or arranged closer to the substrate SUB (or the common source line CSL) than the selected sub-block SELSBLK. For example, as illustrated in FIG. 6, the sub-blocks SBLK0 and SBLK1 that are disposed lower than the sub-block SBLK2 determined as the selected sub-block SELSBLK may be determined as the victim sub-block VSBLK. In other words, the sub-blocks SBLK0 and SBLK1 that are disposed between the sub-block SBLK2 and the erase source (e.g., the substrate SUB) may be determined as the victim sub-block VSBLK.

An example of the data erase operation will be described in detail. In some example embodiments, the data erase operation may be an operation for releasing charges (e.g., electrons) that are stored in memory cells included in the selected sub-block SELSBLK. When the erase voltage VERS is provided to the bulk region in the substrate SUB, charges (e.g., holes) having an opposite polarity may be transferred to the selected sub-block SELSBLK via the substrate SUB and a vertical channel (e.g., the pillar 113 in FIG. 3), based on the erase voltage VERS, and thus the data erase operation may be performed. In other words, the charges having the opposite polarity may be transferred in a direction from a lower part to an upper part.

Although FIG. 6 illustrates an example where the victim sub-block VSBLK is disposed lower than the selected sub-block SELSBLK (e.g., disposed closer to the substrate SUB than the selected sub-block SELSBLK), inventive concepts are not limited thereto. For example, when the erase voltage VERS is not provided to the substrate SUB that is disposed under the memory block BLKA, but is provided to any element or structure that is disposed above the memory block BLKA (e.g., when the charges having the opposite polarity may be transferred in a direction from an upper part to a lower part), the victim sub-block may be disposed upper than the selected sub-block SELSBLK.

Although example embodiments are described based on an example where the data erase operation is performed by transferring the charges (e.g., holes) having the opposite polarity to release the charges (e.g., electrons) stored in memory cells in the selected sub-block SELSBLK, inventive concepts are not limited thereto. For example, when the data erase operation is performed based on one of various schemes, the victim sub-block may be determined based on a location of the selected sub-block SELSBLK and a characteristic of the data erase operation.

In the method of erasing data according to example embodiments, the data erase operation may not be performed immediately after the data erase command for the selected sub-block SELSBLK is received. The data read operation is performed on the at least one victim sub-block VSBLK, the soft program operation is selectively performed on the at least one victim sub-block VSBLK based on a result of the data read operation, and after then the data erase operation may be performed.

For example, in performing the data read operation on the at least one victim sub-block VSBLK (e.g., step S200 in FIG. 1), first victim memory cells among a plurality of victim memory cells included in the at least one victim sub-block VSBLK may be read based on a first read voltage VRDE (step S210). The first victim memory cells may be connected to one wordline of the at least one victim sub-block VSBLK. For example, as illustrated in FIG. 6, the first read voltage VRDE may be applied to the wordline WL01 to read memory cells connected to the wordline WL01. In other words, the data read operation may be performed by units of a single wordline (e.g., RDU1).

In some example embodiments, as illustrated in FIG. 7A, the first read voltage VRDE may be a voltage for determining an erase state P0 of each of the first victim memory cells. For example, memory cells (e.g., on cells) each of which has the erase state P0 and a threshold voltage lower than the first read voltage VRDE may be detected among the memory cells connected to the wordline WL01. Each of the memory cells having the threshold voltage lower than the first read voltage VRDE may be relatively deeply erased, and a characteristic of the relatively deeply erased memory cells may be degraded by the data erase operation for the selected sub-block SELSBLK, and thus it may be required to take appropriate action for the relatively deeply erased memory cells.

In performing the soft program operation on the at least one victim sub-block VSBLK (e.g., step S300 in FIG. 1), when the number N1 of first memory cells (e.g., the number of on cells) among the first victim memory cells is greater than a reference number R1 (step S310: YES), the soft program operation may be performed on the plurality of victim memory cells (step S320). Each of the first memory cells may have a threshold voltage lower than the first read voltage VRDE. For example, as illustrated in FIG. 6, the soft program operation may be performed on all of the memory cells included in the at least one victim sub-block VSBLK.

In some example embodiments, unlike a normal program operation performed by units of a wordline, the soft program operation may be a one-shot program operation in which all of the plurality of victim memory cells in the at least one victim sub-block VSBLK are substantially simultaneously or concurrently programmed. In other words, the soft program operation may be substantially simultaneously or concurrently performed by units of one or more sub-block (e.g., PGMU1).

In some example embodiments, unlike a normal program operation, only threshold voltages of erase memory cells among the plurality of victim memory cells may increase after the soft program operation is performed on the plurality of victim memory cells. Each of the erase memory cells may be a memory cell having the erase state. To increase only the threshold voltages of the erase memory cells, a soft program voltage that is lower than a normal program voltage for the normal program operation may be used in the soft program operation.

For example, comparing the erase state P0 (e.g., a threshold voltage distribution of the erase memory cells) in FIG. 7A before the soft program operation is performed with an erase state P0' in FIG. 7B after the soft program operation is performed, the threshold voltages of all of the erase memory cells may increase after the soft program operation is performed. Particularly, after the soft program operation is performed, the threshold voltage distribution of the erase memory cells may be shifted on the whole such that a memory cell having the erase state P0' and a threshold voltage lower than the first read voltage VRDE does not exist.

In some example embodiments, when comparing the erase state P0 in FIG. 7A before the soft program operation is performed with the erase state P0' in FIG. 7B after the soft program operation is performed, the changes of the threshold voltage distribution may be different from each other at lower and upper limit levels of the threshold voltage distribution. For example, as illustrated in FIG. 7B, when the threshold voltage distribution is changed from the erase state P0 to the erase state P0', an increment SA at the lower limit level of the threshold voltage distribution may be greater than an increment SB at the upper limit level of the threshold voltage distribution.

As described above, since the soft program operation is performed based on the soft program voltage having relatively low level, threshold voltage distributions of program states P1, P2, P3, P4, P5, P6 and P7 other than the erase state P0' may not be changed, even if all of the plurality of victim memory cells are substantially simultaneously or concurrently programmed (e.g., soft-programmed). In other words, only the threshold voltages of the erase memory cells may increase, and threshold voltages of program memory cells having the program states P1 to P7 may not increase.

When the number N1 of the first memory cells among the first victim memory cells is smaller than or equal to the reference number R1 (step S310: NO), the soft program operation on the plurality of victim memory cells may be omitted.

The data erase operation is performed on the selected sub-block SELSBLK after the data read operation is performed and the soft program operation is selectively performed (step S400).

In the method of erasing data in the nonvolatile memory device according to example embodiments, the nonvolatile memory device may include the memory block BLKA having the three-dimensional structure, and the data erase operation may be performed by units of a sub-block, not by units of a memory block. Before the data erase operation is performed on the selected sub-block SELSBLK, the data read operation may be performed on the at least one victim sub-block VSBLK, and the soft program operation may be selectively performed on the at least one victim sub-block VSBLK. Accordingly, the data erase operation for the selected sub-block SELSBLK may be efficiently performed, the damages on data stored in the at least one victim sub-block VSBLK may be prevented, and the data stored in the at least one victim sub-block VSBLK may have relatively high reliability.

Although not described in detail, the memory block BLKA of FIG. 6 may be implemented with a multi-stacked structure. For example, the memory block BLKA may include dummy memory cells connected to dummy wordlines DUM0, DUM1, DUM2, DUM3, DUM4 and DUM5, the sub-blocks SBLK0 and SBLK1 between the dummy wordlines DUM1 and DUM2 may form a first stacked structure, and the sub-blocks SBLK2 and SBLK3 between the dummy wordlines DUM3 and DUM4 may form a second stacked structure. A channel hole should be formed for a vertical channel (e.g., the pillar 113 in FIG. 3) in the memory block BLKA, however, it may be difficult to form the channel hole as a depth of the channel hole increases. To solve this problem, a first channel hole may be formed by penetrating the first stacked structure, the second stacked structure may be formed on the first stacked structure, a second channel hole may be formed by penetrating the second stacked structure such that the first and second channel holes are completely overlapped (e.g., arrangements of the first and second channel holes are perfectly matched), and thus a single channel hole may be formed by connecting the first and second channel holes with each other. The dummy wordlines DUM2 and DUM3 may be formed according to process characteristics. In FIG. 6, the memory block BLKA is illustrated to include two stacked structure, but inventive concepts are not limited thereto.

Although FIGS. 7A and 7B illustrate an example where each memory cell is a 3-bit memory cell storing three bits of data and each memory cell has one of the erase state P0 and the program states P1 to P7, inventive concepts are not limited thereto. For example, each memory cell may be a multi-level memory cell (MLC) in which two or more bits are stored in each memory cell, or a single-level memory cell (SLC) in which only one bit is stored in each memory cell.

Figure 8:
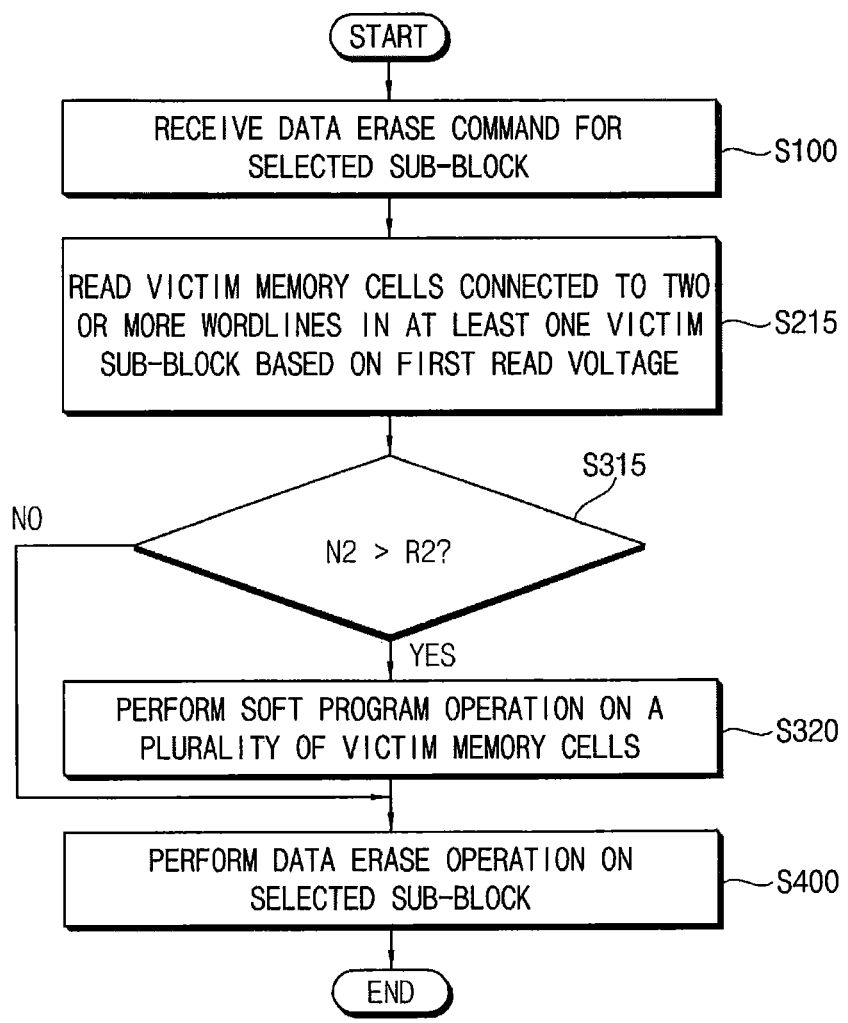
FIG. 8 is a flow chart illustrating a method of erasing data in a nonvolatile memory device according to example embodiments.
Figure 9:
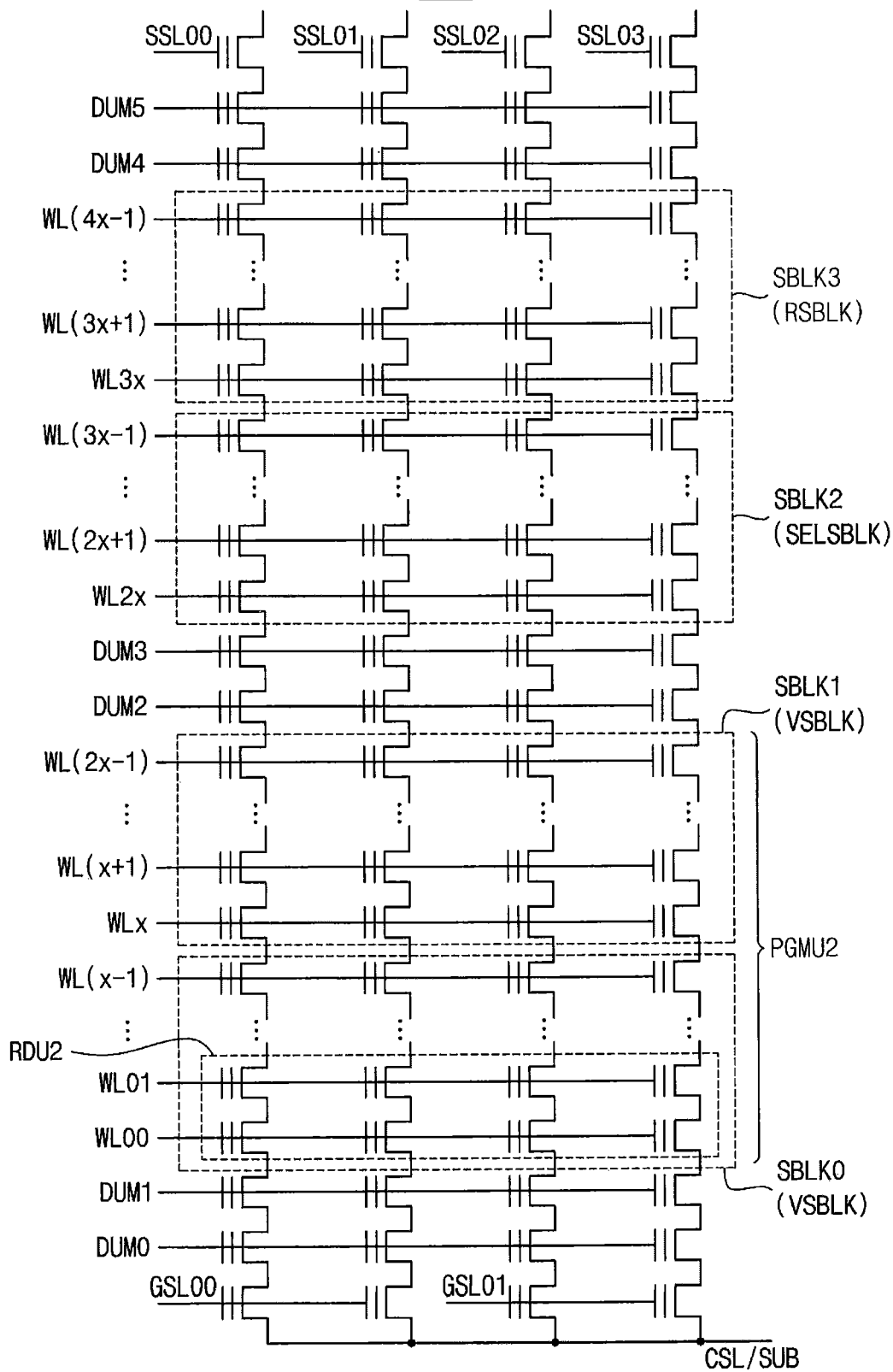
FIG. 9 is a diagram that illustrates a method of erasing data in the nonvolatile memory device of FIG. 8.

FIG. 8 is a flow chart illustrating a method of erasing data in a nonvolatile memory device according to example embodiments. FIG. 9 is a diagram for describing the method of erasing data in the nonvolatile memory device of FIG. 8.

An example of FIG. 8 may be substantially the same as the example of FIG. 5, except that steps S210 and S310 in FIG. 5 are replaced with steps S215 and S315 in FIG. 8, respectively. A memory block BLKB of FIG. 9 may be substantially the same as the memory block BLKA of FIG. 6, except that the unit RDU1 of the data read operation in FIG. 6 is changed to a unit RDU2 of the data read operation in FIG. 9. Thus, repeated explanation will be omitted.

Referring to FIGS. 8 and 9, in performing the data read operation on the at least one victim sub-block VSBLK (e.g., step S200 in FIG. 1), second victim memory cells among the plurality of victim memory cells included in the at least one victim sub-block VSBLK may be read based on the first read voltage VRDE (step S215). The second victim memory cells may be connected to two or more wordlines of the at least one victim sub-block VSBLK. For example, as illustrated in FIG. 9, the first read voltage VRDE may be applied to the wordlines WL00 and WL01 to read memory cells connected to the wordlines WL00 and WL01. In other words, the data read operation may be performed by units of two wordlines (e.g., RDU2). The memory cells connected to the wordlines WL00 and WL01 may be substantially simultaneously or sequentially read.

In performing the soft program operation on the at least one victim sub-block VSBLK (e.g., step S300 in FIG. 1), when the number N2 of second memory cells (e.g., the number of on cells) among the second victim memory cells is greater than a reference number R2 (step S315: YES), the soft program operation may be performed on the plurality of victim memory cells (step S320). Each of the second memory cells may have a threshold voltage lower than the first read voltage VRDE. For example, the reference number R2 in FIG. 8 may be different from the reference number R1 in FIG. 5.

In some example embodiments, as illustrated in FIG. 9, the soft program operation may be a one-shot program operation in which all of the plurality of victim memory cells in the at least one victim sub-block VSBLK are substantially simultaneously or concurrently programmed. In other words, the soft program operation may be substantially simultaneously or concurrently performed by units of one or more sub-block (e.g., PGMU2). In addition, the soft program operation may be performed based on the soft program voltage having relatively low level such that only threshold voltages of erase memory cells among the plurality of victim memory cells increase after the soft program operation is performed on the plurality of victim memory cells.

When the number N2 of the second memory cells among the second victim memory cells is smaller than or equal to the reference number R2 (step S315: NO), the soft program operation on the plurality of victim memory cells may be omitted.

Figure 10:
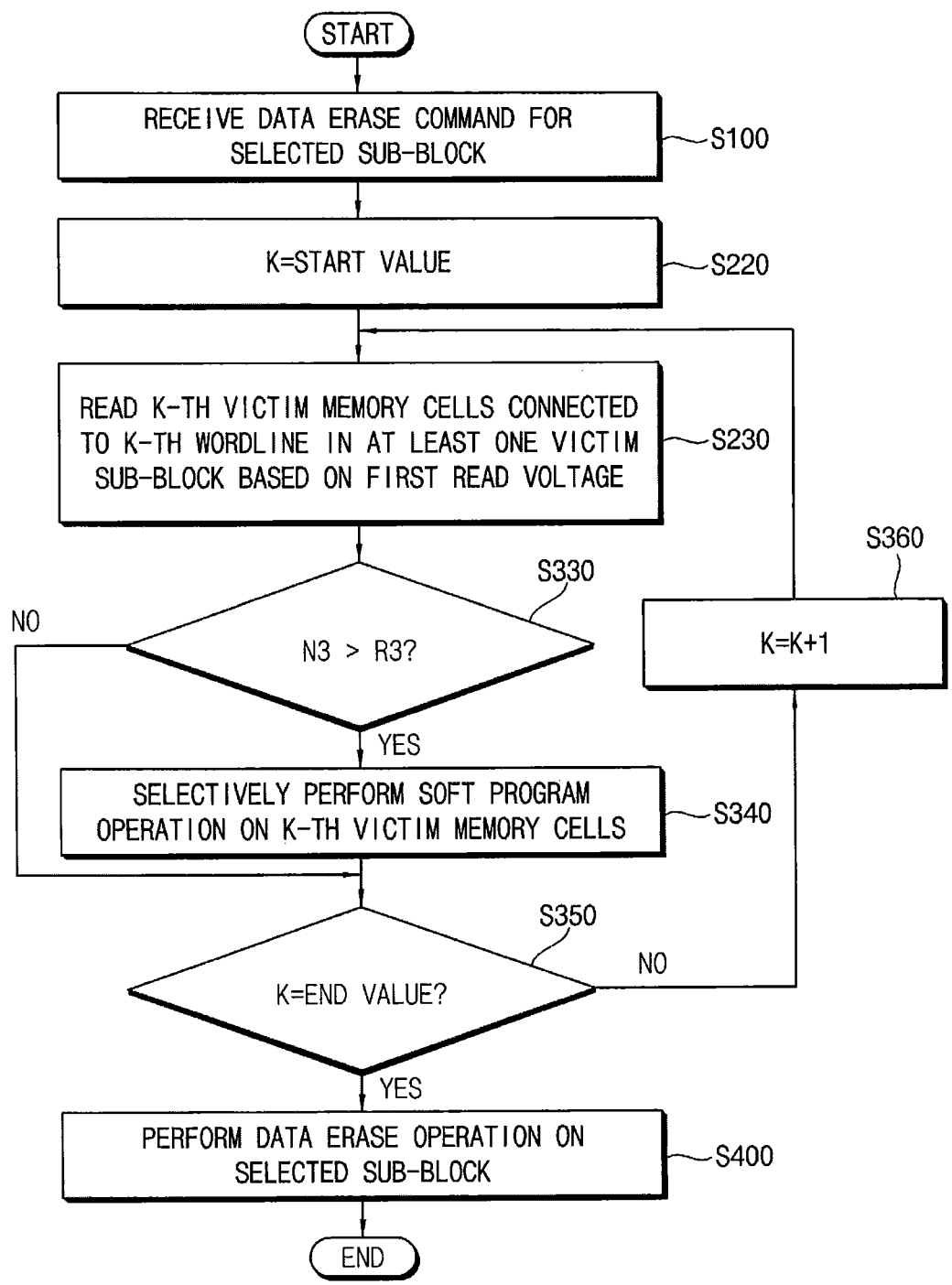
FIG. 10 is a flow chart illustrating a method of erasing data in a nonvolatile memory device according to example embodiments.
Figure 11:
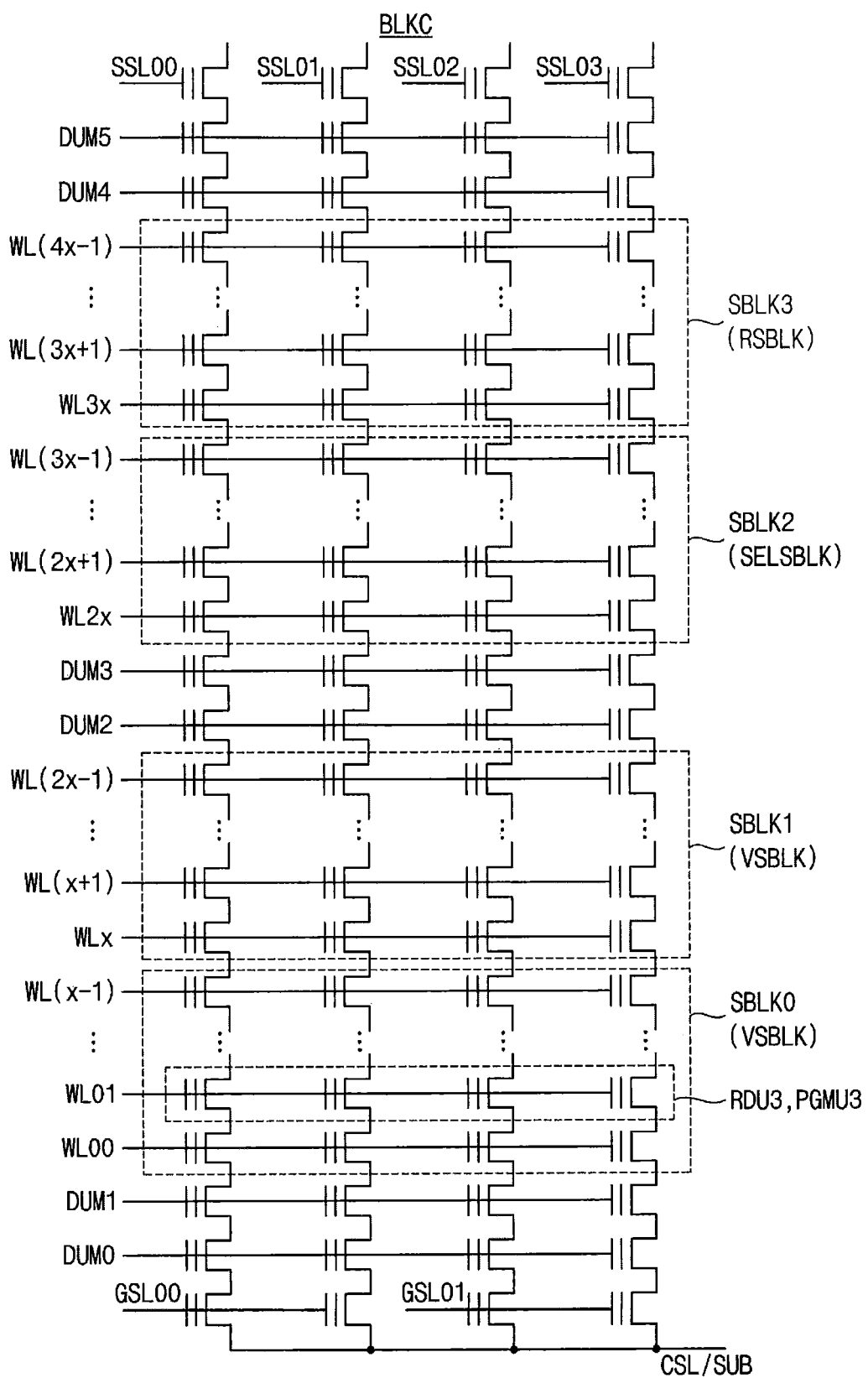
FIGS. 11 and 12 are diagrams that illustrate methods of erasing data in the nonvolatile memory device of FIG. 10.
Figure 12:
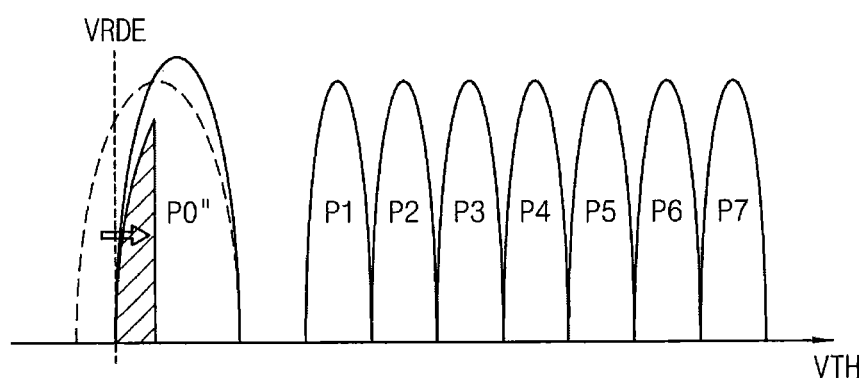

FIG. 10 is a flow chart illustrating a method of erasing data in a nonvolatile memory device according to example embodiments. FIGS. 11 and 12 are diagrams for describing the method of erasing data in the nonvolatile memory device of FIG. 10.

Steps S100 and S400 in FIG. 10 may be substantially the same as steps S100 and S400 in FIG. 5, respectively. A memory block BLKC of FIG. 11 may be substantially the same as the memory block BLKA of FIG. 6, except that the unit PGMU1 of the soft program operation in FIG. 6 is changed to a unit PGMU3 of the soft program operation in FIG. 11. An example of FIG. 12 may be substantially the same as an example of FIG. 7B, except that the erase state P0' in FIG. 7B is changed to an erase state P0" in FIG. 12. Thus, repeated explanation will be omitted.

Referring to FIGS. 7A, 10, 11 and 12, in performing the data read operation on the at least one victim sub-block VSBLK (e.g., step S200 in FIG. 1), first through N-th victim memory cells among the plurality of victim memory cells included in the at least one victim sub-block VSBLK may be sequentially read based on the first read voltage VRDE, where N is a natural number greater than or equal to two. The first through N-th victim memory cells may be connected to first through N-th wordlines, respectively.

For example, K may be set to a start value, where K is a natural number greater than or equal to one and smaller than or equal to N (step S220). K-th victim memory cells connected to a K-th wordline may be read based on the first read voltage VRDE (step S230). For example, as illustrated in FIG. 11, since the at least one victim sub-block VSBLK is connected to first through 2x wordlines WL00 to WL(2x01), where x is a natural number greater than or equal to two, the start value may be "1." Thus, K may be set to "1" in step S220, and the first read voltage VRDE may be applied to the first wordline WL00 to read first victim memory cells connected to the first wordline WL00 in step S230.

In performing the soft program operation on the at least one victim sub-block VSBLK (e.g., step S300 in FIG. 1), when the number N3 of memory cells (e.g., the number of on cells) among the K-th victim memory cells is greater than a reference number R3 (step S330: YES), the soft program operation may be performed on the K-th victim memory cells (step S340). Each of the on cells may have a threshold voltage lower than the first read voltage VRDE. For example, when the number of on cells among the first victim memory cells is greater than the reference number R3, the soft program operation may be performed on the first victim memory cells. For example, the reference number R3 in FIG. 11 may be substantially the same as or different from the reference number R1 in FIG. 5.

In some example embodiments, as illustrated in FIG. 11, the soft program operation may be a program operation in which the plurality of victim memory cells in the at least one victim sub-block VSBLK are programmed by units of a wordline (e.g., PGMU3). In other words, unlike examples of FIGS. 6 and 9, a unit of the data read operation RDU3 and a unit of the soft program operation PGMU3 may be substantially the same as each other in an example of FIG. 11. In addition, the soft program operation may be performed based on the soft program voltage having relatively low level such that only threshold voltages of erase memory cells increase after the soft program operation is performed on.

When the number N3 of memory cells (e.g., the number of on cells) among the K-th victim memory cells is smaller than or equal to the reference number R3 (step S330: NO), the soft program operation on the K-th victim memory cells may be omitted.

When K is not an end value (step S350: NO), K may increase (step S360), and steps S230, S330 and S340 may be repeated based on increased K. For example, as illustrated in FIG. 11, since the at least one victim sub-block VSBLK is connected to the first through 2x wordlines WL00 to WL(2x01), the end value may be "2x." Thus, after steps S230, S330 and S340 are performed for the first victim memory cells, steps S230, S330 and S340 may be sequentially performed for second through 2x-th victim memory cells connected to second through 2x-th wordlines WL01 to WL(2x01).

In some example embodiments, comparing the erase state P0 in FIG. 7A before the soft program operation is performed with the erase state P0" in FIG. 12 after the soft program operation is performed, the threshold voltages of some of the erase memory cells may increase after the soft program operation is performed. Particularly, after the soft program operation is performed, the threshold voltage distribution of the erase memory cells may be partially shifted such that a memory cell having the erase state P0" and a threshold voltage lower than the first read voltage VRDE does not exist. For example, only threshold voltages (e.g., a hatched portion in FIG. 12) of erase memory cells having threshold voltages lower than the first read voltage before the soft program operation is performed may increase after the soft program operation is performed.

In some example embodiments, comparing the erase state P0 in FIG. 7A before the soft program operation is performed with the erase state P0" in FIG. 12 after the soft program operation is performed, changes of the threshold voltage distribution may be different from each other at lower and upper limit levels of the threshold voltage distribution. For example, as illustrated in FIG. 12, when the threshold voltage distribution is changed from the erase state P0 to the erase state P0", the lower limit level of the threshold voltage distribution may increase higher than the first read voltage VRDE, and the upper limit level of the threshold voltage distribution may be maintained to almost the same level.

Figure 13:
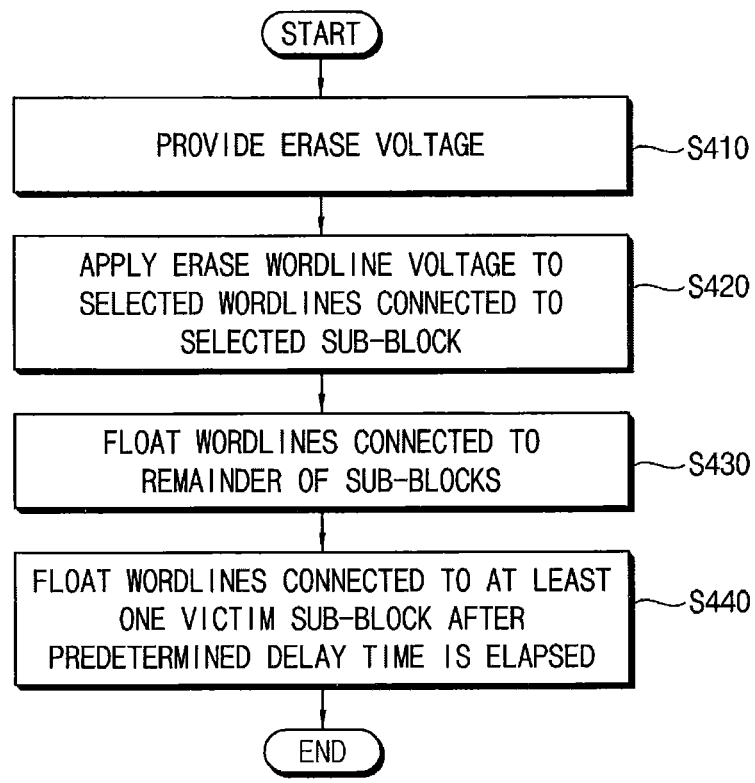
FIG. 13 is a flow chart of operations/steps that illustrate performing a data erase operation on a selected sub-block in FIGS. 1, 5, 8 and 10.
Figure 14:
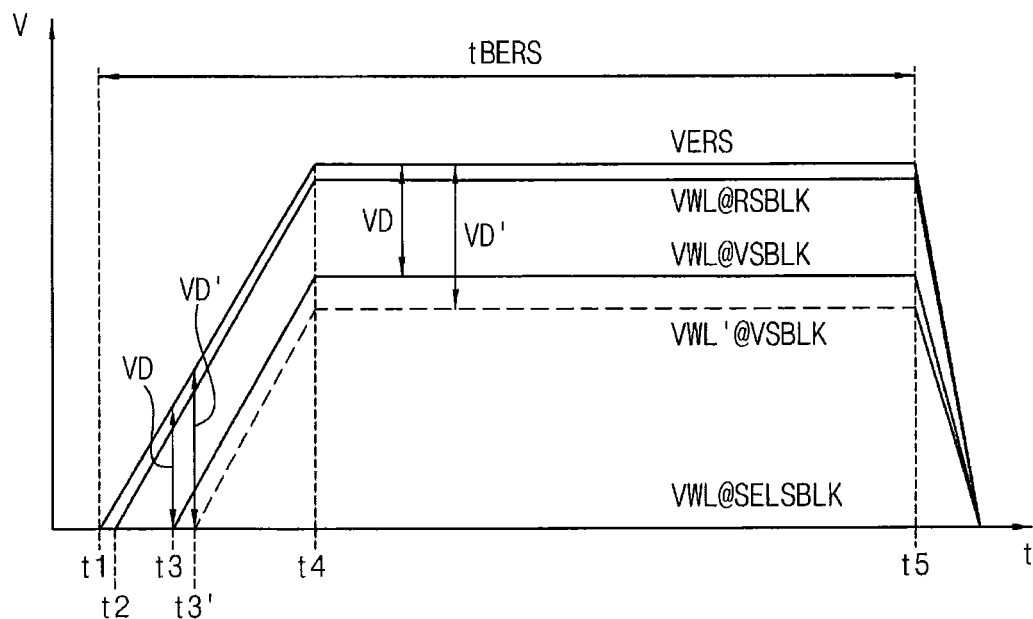
FIG. 14 is a diagram for describing the data erase operation of FIG. 13.

FIG. 13 is a flow chart illustrating an example of performing a data erase operation on a selected sub-block in FIGS. 1, 5, 8 and 10. FIG. 14 is a diagram for describing the data erase operation of FIG. 13. Referring to FIGS. 6, 13 and 14, in performing the data erase operation on the selected sub-block SELSBLK (e.g., step S400 in FIGS. 1, 5, 8 and 10), the erase voltage VERS may be provided to the memory block BLKA (step S410), at time t1 that represents a start time of a data erase interval tBERS in which the data erase operation is performed. For example, the erase voltage VERS may be a high voltage. For example, the erase voltage VERS may be provided to a bulk region (e.g., a well) in the substrate SUB (e.g., the substrate 111 in FIG. 3).

In addition, in parallel with a start of the data erase operation, an erase wordline voltage may be applied to the selected wordlines WL2x to WL(3x−1) connected to the selected sub-block SELSBLK (step S420), at time t1. For example, the erase wordline voltage may be a ground voltage (e.g., about 0V). In FIG. 14, "VWL@SELSBLK" represents voltages on the selected wordlines WL2x to WL(3x−1).

An erase pass voltage may be applied to the unselected wordlines WL00 to WL(2x−1) and WL3x to WL(4x−1) other than the selected wordlines WL2x to WL(3x−1) to float the unselected wordlines WL00 to WL(2x−1) and WL3x to WL(4x−1). The delayed floating scheme in which a floating timing of the unselected wordlines WL00 to WL(2x−1) connected to the victim sub-block VSBLK is set to be different from a floating timing of the unselected wordlines WL3x to WL(4x−1) connected to the remainder sub-block RSBLK may be used. The remainder sub-block RSBLK may be a sub-block other than the selected sub-block SELSBLK and the victim sub-block VSBLK For example, a first erase pass voltage may be applied to the unselected wordlines WL3x to WL(4x−1) connected to the remainder sub-block RSBLK (e.g., the sub-block SBLK3) to float the unselected wordlines WL3x to WL(4x−1) connected to the remainder sub-block RSBLK (step S430), at time t2 at which a predetermined first delay time is elapsed from time t1. For example, the first erase pass voltage may be a high voltage that is substantially the same as or similar to the erase voltage VERS. In FIG. 14, "VWL@RSBLK" represents voltages on the unselected wordlines WL3x to WL(4x−1), and it may be checked that a stable level of "VWL@RSBLK" may be similar to a stable level of the erase voltage VERS. The first delay time may be very short or may be zero according to example embodiments.

A second erase pass voltage may be applied to the unselected wordlines WL00 to WL(2x−1) connected to the victim sub-block VSBLK (e.g., the sub-blocks SBLK0 and SBLK1) to float the unselected wordlines WL00 to WL(2x−1) connected to the victim sub-block VSBLK (step S440), at time t3 at which a predetermined second delay time is elapsed from time t1. The second delay time may be longer than the first delay time. For example, the second erase pass voltage may be a voltage that is lower than the erase voltage VERS. In FIG. 14, "VWL@VSBLK" represents voltages on the unselected wordlines WL00 to WL(2x−1).

In some example embodiments, the second delay time may be determined based on a detection level VD that represents a level difference between the erase voltage VERS and the voltages on the unselected wordlines WL00 to WL(2x−1) connected to the victim sub-block VSBLK. For example, the second delay time may decrease as the detection level VD becomes smaller, and the second delay time may increase as the detection level VD becomes greater. In addition, during the whole data erase interval tBERS, the level difference between the erase voltage VERS and the voltages on the unselected wordlines WL00 to WL(2x−1) connected to the victim sub-block VSBLK may be always fixed.

An increment of all voltages may be stopped at time t4, and voltage levels at time t4 may be maintained during a predetermined time interval to perform the data erase operation on the selected sub-block SELSBLK. A supply of all voltages may be stopped at time t5 that represents an end time of the data erase interval tBERS.

As described with reference to FIG. 6, the data erase operation may be performed by transferring the charges (e.g., holes) having the opposite polarity to release the charges (e.g., electrons) stored in memory cells in the selected sub-block SELSBLK. In this example, if the erase wordline voltage is applied to the selected wordlines WL2x to WL(3x−1) connected to the selected sub-block SELSBLK and the unselected wordlines WL00 to WL(2x−1) connected to the victim sub-block VSBLK are floated at the same time, the charges having the opposite polarity may not be sufficiently transferred to the selected sub-block SELSBLK, and thus the data erase operation may be performed based on the delayed floating scheme by setting the second delay time between time t1 and time t3 and by transferring the charges having the opposite polarity to the selected sub-block SELSBLK via the substrate SUB (e.g., the erase source) and the vertical channel during the second delay time. However, data stored in the victim sub-block VSBLK may be damaged (e.g., soft-erased) as the second delay time increases, and thus it may be required to reduce the second delay time.

"VWL'@VSBLK" illustrated by a dotted line in FIG. 14 represents voltages on unselected wordlines connected to a conventional victim sub-block. In a conventional technique, relatively long delay time between time t1 and time t3' may be set based on relatively great detection level VD'. However, data stored in the victim sub-block VSBLK may be damaged by the relatively long delay time, and thus it may be required to reduce the delay time.

In the method of erasing data according to example embodiments, relatively short second delay time between time t1 and time t3 may be set based on relatively small detection level VD. In addition, the data read operation is performed on the at least one victim sub-block VSBLK, the soft program operation is selectively performed on the at least one victim sub-block VSBLK based on a result of the data read operation, and thus the charges having the opposite polarity may not be sufficiently transferred to the selected sub-block SELSBLK even if the second delay time becomes shorter. Accordingly, the data erase operation for the selected sub-block SELSBLK may be efficiently performed, the damages on data stored in the at least one victim sub-block VSBLK may be prevented, and the data stored in the at least one victim sub-block VSBLK may have relatively high reliability.

In addition, the remainder sub-block RSBLK may not affect an operation of transferring the charges having the opposite polarity to the selected sub-block SELSBLK, and thus, the first delay time may be set to be very short or zero.

As will be appreciated by those skilled in the art, the present disclosure may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device. For example, the computer readable medium may be a non-transitory computer readable medium.

Figure 15:
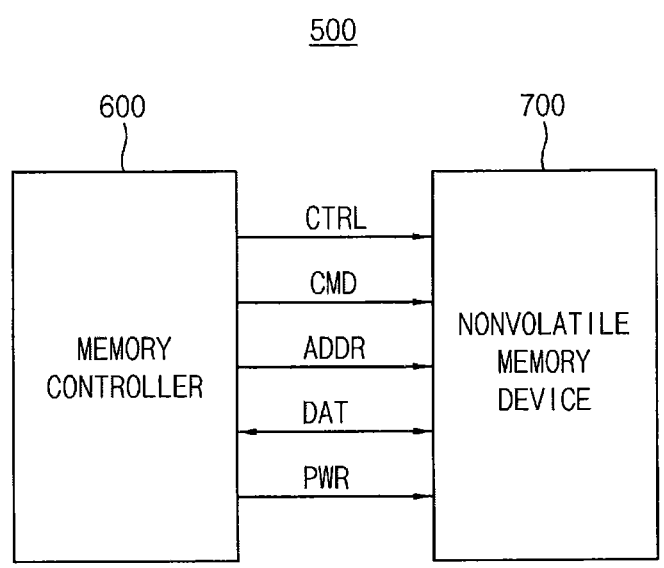
FIG. 15 is a block diagram illustrating a memory system according to example embodiments.

FIG. 15 is a block diagram illustrating a memory system according to example embodiments. Referring to FIG. 15, a memory system 500 includes a memory controller 600 and at least one nonvolatile memory device 700. The nonvolatile memory device 700 may correspond to the nonvolatile memory device according to example embodiments, and may perform data erase, program (or write) and/or read operations under control of the memory controller 600. The nonvolatile memory device 700 may receive a command CMD and an address ADDR through I/O lines from the memory controller 600 for performing such operations, and may exchange data DAT with the memory controller 600 for performing such program or read operation. In addition, the nonvolatile memory device 700 may receive a control signal CTRL through a control line from the memory controller 600. In addition, the nonvolatile memory device 700 receives a power PWR through a power line from the memory controller 600.

Figure 16:
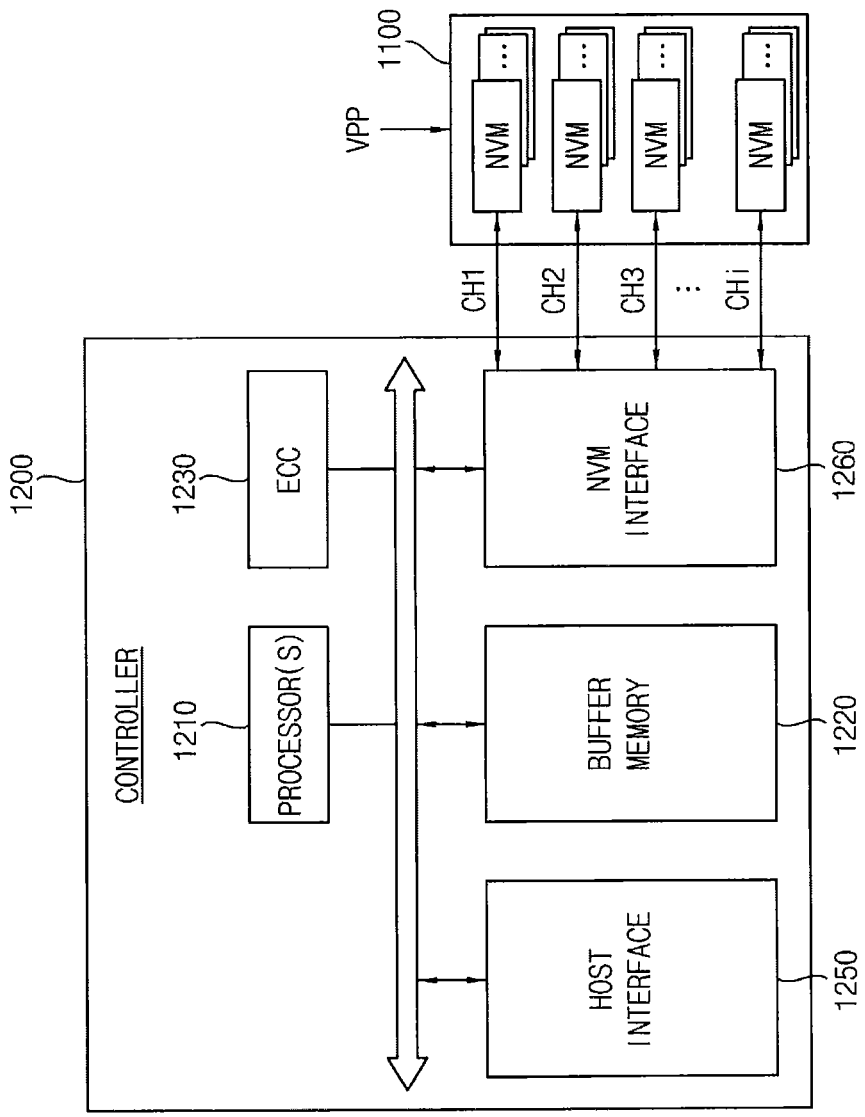
FIG. 16 is a block diagram illustrating a storage device that includes a nonvolatile memory device according to example embodiments.

FIG. 16 is a block diagram illustrating a storage device that includes a nonvolatile memory device according to example embodiments. Referring to FIG. 16, a storage device 1000 includes a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc. The controller 1200 may be connected to the nonvolatile memory devices 1100 via a plurality of channels CH1, CH2, CH3 . . . CHi. The controller 1200 may include one or more processors 1210, a buffer memory 1220, an error correction code (ECC) circuit 1230, a host interface 1250 and a nonvolatile memory interface 1260.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100. Each of the nonvolatile memory devices 1100 may correspond to the nonvolatile memory device according to example embodiments, and may be optionally supplied with an external high voltage VPP.

The inventive concept may be applied to various devices and systems that include an nonvolatile memory device. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (loT) device, an internet of everything (IoE) device, an e-book reader, a virtual reality (VR) device, an augmented reality (AR) device, a robotic device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a nonvolatile memory device, comprising:
    performing a data read operation on at least one victim sub-block within a memory block containing a plurality of sub-blocks, in response to an erase command directed to a selected sub-block within the plurality of sub-blocks; then
    performing a soft program operation on the at least one victim sub-block; and then
    performing a data erase operation on the selected sub-block within the plurality of sub-blocks.

2. The method of claim 1, wherein said performing a data erase operation comprises providing an erase voltage to a bulk region of a substrate on which the memory block extends; and wherein the at least one victim sub-block is disposed between the selected sub-block and the substrate.

3. The method of claim 1, wherein the memory block comprises a common source line; and wherein the at least one victim sub-block extends closer to the common source line relative to the selected sub-block.

4. The method of claim 1, wherein said performing a data read operation on the at least one victim sub-block comprises reading first victim memory cells among a plurality of victim memory cells included in the at least one victim sub-block, using a first read voltage; and wherein the first victim memory cells are commonly connected to a first word line within the memory block.

5. The method of claim 4, wherein the soft program operation is a one-shot program operation during which at least a plurality of the first victim memory cells are simultaneously programmed.

6. The method of claim 1, wherein the soft program operation is a one-shot program operation during which at least a plurality of memory cells within the at least one victim sub-block are simultaneously programmed to thereby increase their respective threshold voltages.

7. A method of erasing data in a nonvolatile memory device that includes a memory block including memory cells stacked in a direction intersecting a substrate, the memory block being divided into a plurality of sub-blocks configured to be erased independently, the method comprising:
    receiving a data erase command for a selected sub-block among the plurality of sub-blocks;
    performing a data read operation on at least one victim sub-block among the plurality of sub-blocks, in response to the data erase command; then
    selectively performing a soft program operation on the at least one victim sub-block based on a result of the data read operation; and then
    performing a data erase operation on the selected sub-block after the data read operation is performed and the soft program operation is selectively performed.

8. The method of claim 7, wherein the at least one victim sub-block is disposed closer to an erase source used in the data erase operation than the selected sub-block.

9. The method of claim 8, wherein:
    in the data erase operation, an erase voltage is provided to a bulk region in the substrate on which the memory block is formed, and
    the at least one victim sub-block is disposed lower than the selected sub-block such that the at least one victim sub-block is closer to the substrate than the selected sub-block.

10. The method of claim 8, wherein the at least one victim sub-block is disposed closer to a common source line than the selected sub-block.

11. The method of claim 7, wherein performing the data read operation on the at least one victim sub-block includes:
    reading first victim memory cells among a plurality of victim memory cells included in the at least one victim sub-block based on a first read voltage, the first victim memory cells being connected to one wordline.

12. The method of claim 11, wherein selectively performing the soft program operation on the at least one victim sub-block includes:
    when a number of first memory cells among the first victim memory cells is greater than a reference number, performing the soft program operation on the plurality of victim memory cells, each of the first memory cells having a threshold voltage lower than the first read voltage.

13. The method of claim 12, wherein the soft program operation is a one-shot program operation in which all of the plurality of victim memory cells are simultaneously programmed.

14. The method of claim 12, wherein the first read voltage is a voltage for determining an erase state of each of the first victim memory cells.

15. The method of claim 12, wherein:
after the soft program operation is performed on the plurality of victim memory cells, threshold voltages of all of erase memory cells among the plurality of victim memory cells increase, and
each of the erase memory cells is a memory cell having an erase state.

16. The method of claim 12, wherein, when the number of the first memory cells among the first victim memory cells is smaller than or equal to the reference number, the soft program operation on the plurality of victim memory cells is omitted.

17. The method of claim 7, wherein performing the data read operation on the at least one victim sub-block includes:
reading first victim memory cells among a plurality of victim memory cells included in the at least one victim sub-block based on a first read voltage, the first victim memory cells being connected to two or more wordlines.

18. The method of claim 7, wherein performing the data read operation on the at least one victim sub-block includes:
sequentially reading first through N-th victim memory cells among a plurality of victim memory cells included in the at least one victim sub-block based on a first read voltage, where N is a natural number greater than or equal to two, the first through N-th victim memory cells being connected to first through N-th wordlines, respectively.

19. The method of claim 18, wherein selectively performing the soft program operation on the at least one victim sub-block includes:
when a number of first memory cells among K-th victim memory cells is greater than a reference number, selectively performing the soft program operation on the K-th victim memory cells, where K is a natural number greater than or equal to one and smaller than or equal to N, each of the first memory cells having a threshold voltage lower than the first read voltage.

20. A method of operating a nonvolatile memory device, comprising:
performing a data read operation on at least one victim sub-block within a memory block containing a plurality of sub-blocks, in response to an erase command directed to a selected sub-block within the plurality of sub-blocks; then
performing a soft program operation on the at least one victim sub-block to inhibit an over-erase condition in a plurality of the memory cells within the at least one victim sub-block, in response to the erase command; and then
performing a data erase operation on the selected sub-block within the plurality of sub-blocks, in response to the erase command.

* * * * *